United States Patent
Sogabe (10) Patent No.: US 8,891,572 B2
(45) Date of Patent: Nov. 18, 2014

(54) SEMICONDUCTOR LASER DEVICE HAVING REFLECTING AND EMITTING SURFACES

(75) Inventor: Ryuichi Sogabe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 170 days.

(21) Appl. No.: 12/801,168

(22) Filed: May 26, 2010

(65) Prior Publication Data

US 2010/0303118 A1     Dec. 2, 2010

(30) Foreign Application Priority Data

May 27, 2009   (JP) .................................. 2009-127207

(51) Int. Cl.
| | |
|---|---|
| *H01S 5/028* | (2006.01) |
| *B82Y 20/00* | (2011.01) |
| *H01S 5/022* | (2006.01) |
| *H01S 5/12* | (2006.01) |
| *H01S 5/02* | (2006.01) |
| *H01S 5/22* | (2006.01) |
| *H01S 5/0683* | (2006.01) |
| *H01S 5/343* | (2006.01) |
| *H01S 5/20* | (2006.01) |

(52) U.S. Cl.
CPC ............. *H01S 5/02252* (2013.01); *B82Y 20/00* (2013.01); *H01S 5/0202* (2013.01); *H01S 5/22* (2013.01); *H01S 5/0683* (2013.01); *H01S 5/34333* (2013.01); *H01S 5/2009* (2013.01); *H01S 5/1221* (2013.01); *H01S 5/0287* (2013.01)
USPC ..................................................... 372/49.01

(58) Field of Classification Search
USPC ..................................................... 372/49.01
See application file for complete search history.

(56) References Cited

U.S. PATENT DOCUMENTS

| | | | |
|---|---|---|---|
| 4,843,610 A | 6/1989 | Okada et al. ..................... 372/31 |
| 2002/0075928 A1* | 6/2002 | Genei et al. ..................... 372/49 |
| 2004/0124500 A1* | 7/2004 | Kawagoe ....................... 257/548 |
| 2007/0246720 A1 | 10/2007 | Kamikawa et al. ............. 257/94 |
| 2009/0252191 A1* | 10/2009 | Kubota et al. ............... 372/50.11 |

FOREIGN PATENT DOCUMENTS

| | | | |
|---|---|---|---|
| JP | 63-293990 | 11/1988 | ............... H01S 3/18 |
| JP | 01-184893 | 7/1989 | |
| JP | 03-012980 | 1/1991 | ............... H01S 3/18 |
| JP | 2003-324247 | 11/2003 | |
| JP | 2007-318088 | 12/2007 | ............. H01S 5/028 |

OTHER PUBLICATIONS

Translation of JP01-184893.*

* cited by examiner

*Primary Examiner* — Tod T Van Roy
*Assistant Examiner* — Marcia Golub-Miller
(74) *Attorney, Agent, or Firm* — Harness, Dickey & Pierce, P.L.C.

(57) ABSTRACT

A semiconductor laser device has structure including: a semiconductor laser chip having an emission surface and a reflection surface which are opposing end surfaces of a resonator; and a photodiode for detecting light that exits from the reflection surface side, the photodiode being used in a wavelength band where a sensitivity of the photodiode rises as a wavelength lengthens, in which the emission surface has a first dielectric multilayer film formed thereon and the reflection surface has a second dielectric multilayer film formed thereon, and in which, when a wavelength at which a reflectance of the first dielectric multilayer film peaks is given as $\lambda_f$ and a wavelength at which a reflectance of the second dielectric multilayer film peaks is given as $\lambda_r$, a relation $\lambda_f < \lambda_r$ is satisfied.

9 Claims, 12 Drawing Sheets

SEMICONDUCTOR LASER DEVICE HAVING REFLECTING AND EMITTING SURFACES

The present application claims priority from Japanese Patent Application No. 2009-127207 filed on May 27, 2009, the content of which is hereby incorporated by reference into this application.

BACKGROUND OF THE INVENTION

1. Field of the Invention

The present invention relates to a semiconductor laser device including a semiconductor laser chip in which coating films are formed for an emission surface and a reflection surface, which are opposing end surfaces of a resonator.

2. Description of Related Art

A semiconductor laser element used in an optical disk drive generally includes a built-in photodiode for detecting laser power, in addition to a semiconductor laser chip, and laser power is controlled based on a current value (monitor current) converted by the photodiode through photoelectric effect. Inexpensive photodiodes which use silicon (Si) have conventionally been employed in 780 nm-range semiconductor laser elements for CDs and 650 nm-range semiconductor laser elements for DVDs.

In 400 nm-range semiconductor laser devices, which are for the next generation Blu-ray disks, however, the temperature dependence of semiconductor laser devices causes the wavelength of an output laser to grow longer as the ambient temperature rises, despite laser power being kept constant. The resultant problem is wild fluctuations in monitor current detected by the photodiode.

Figure 12:
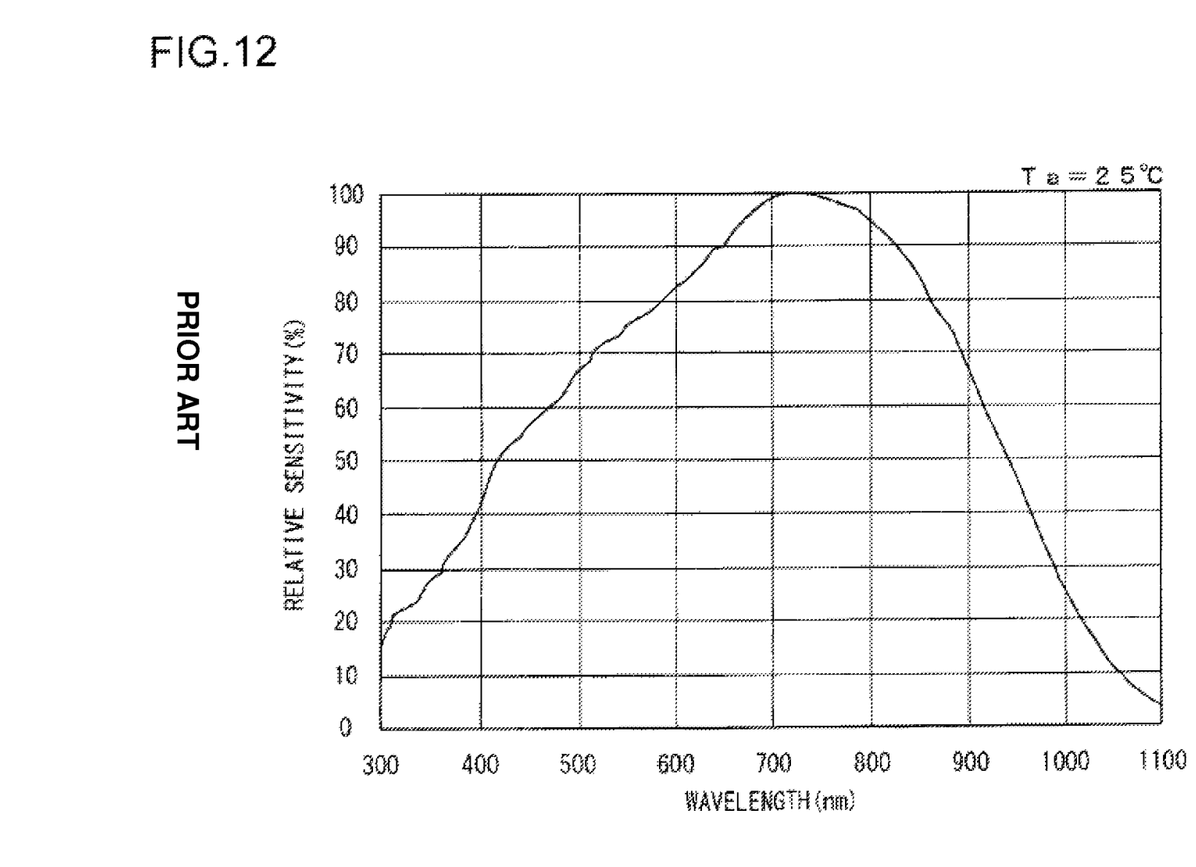
FIG. 12 is a graph showing the wavelength dependence of the sensitivity of a photodiode that uses Si.

As illustrated in FIG. 12, one cause of this is that the sensitivity to wavelengths in converting light into a current varies greatly depending on Si used as the material of the photodiode.

It is consequently a common practice in conventional semiconductor laser devices with a built-in photodiode to take the fact that the photodiode sensitivity varies depending on the wavelength as a given and to correct the sensitivity considering the wavelength dependence of the monitor current on the control side.

However, the semiconductor laser chip itself experiences fluctuations in band gap due to changes in ambient temperature, causing the wavelength of its emitted laser to vary. Correcting the photodiode sensitivity alone is thus not enough to achieve specifications capable of auto power control (APC) driving (a ±5% power change in response to a change in ambient temperature).

SUMMARY OF THE INVENTION

The present invention has been made in view of the above, and an object of the present invention is therefore to provide a semiconductor laser device that uses a wavelength-dependent photodiode and yet has specifications capable of auto power control (APC) driving.

In order to attain the above-mentioned object, the present invention provides a semiconductor laser device including: a semiconductor laser chip having an emission surface and a reflection surface which are opposing end surfaces of a resonator; and a photodiode for detecting light that exits from the reflection surface side, the photodiode being used in a wavelength band where a sensitivity of the photodiode rises as a wavelength lengthens, in which the emission surface has a first dielectric multilayer film formed thereon and the reflection surface has a second dielectric multilayer film formed thereon, and in which, when a wavelength at which a reflectance of the first dielectric multilayer film peaks is given as $\lambda_f$ and a wavelength at which a reflectance of the second dielectric multilayer film peaks is given as $\lambda_r$, a relation $\lambda_f < \lambda_r$ is satisfied.

In the above-mentioned semiconductor laser device, when an oscillation wavelength of the semiconductor laser chip is given as $\lambda_1$, a relation $\lambda_1 - 20 \text{ nm} < \lambda_f < \lambda_1 < \lambda_r < \lambda_1 + 20 \text{ nm}$ may be satisfied.

Further, in the above-mentioned semiconductor laser device, a relation $\lambda_r - \lambda_f = 20 \text{ nm}$ may be satisfied.

Further, in the above-mentioned semiconductor laser device, when power of light that exits the emission surface is given as $P_f$ and power of light that exits the reflection surface is given as $P_r$, a power ratio $P_r/P_f$ may decrease as the wavelength lengthens.

Further, in the above-mentioned semiconductor laser device, when the sensitivity of the photodiode is given as $\alpha$, $P_r/P_f \times \alpha$ may take an extremal value at the oscillation wavelength $\lambda_1$ of the semiconductor laser chip.

Further, in the above-mentioned semiconductor laser device, the first dielectric multilayer film may include a third film and a fourth film, and, when a refractive index of the third film is given as $n_3$, a physical film thickness of the third film is given as $d_3$, a refractive index of the fourth film is given as $n_4$, a physical film thickness of the fourth film is given as $d_4$, and an oscillation wavelength of the semiconductor laser chip is given as $\lambda_1$, relations $n_3 < n_4$, $d_3 = \lambda_f/4n_3$, and $d_4 = \lambda_f/4n_4$ are satisfied, and the first dielectric multilayer film may have a reflectance of 10 to 50%.

Further, in the above-mentioned semiconductor laser device, the third film may be formed from $SiO_2$, and the fourth film may be formed from one member selected from a group consisting of: $Al_2O_3$; $Ta_2O_5$; $TiO_2$; $ZrO_2$; $Nb_2O_5$; and $Si_3N_4$.

Further, in the above-mentioned semiconductor laser device, the second dielectric multilayer film may include a seventh film and an eighth film, and, when a refractive index of the seventh, film is given as $n_7$, a physical film thickness of the seventh film is given as $d_7$, a refractive index of the eighth film is given as $n_8$, a physical film thickness of the eighth film is given as $d_8$, and an oscillation wavelength of the semiconductor laser chip is given as $\lambda_1$, relations $n_7 < n_8$, $d_7 = \lambda_r/4n_7$, and $d_8 = \lambda_r/4n_8$ may be satisfied, and the second dielectric multilayer film may have a reflectance of 80%.

Further, in the above-mentioned semiconductor laser device, the seventh film may be formed from $SiO_2$, and the eighth film may be a member selected from a group consisting of $Al_2O_3$, $Ta_2O_5$, $TiO_2$, $ZrO_2$, $Nb_2O_5$, and $Si_3N_4$.

According to the present invention, the wavelength dependence of the monitor current is small and specifications capable of APC driving (a ±5% power change in response to a change in ambient temperature) despite a change in ambient temperature are thus achieved.

DETAILED DESCRIPTION OF PREFERRED EMBODIMENT

Figure 1:
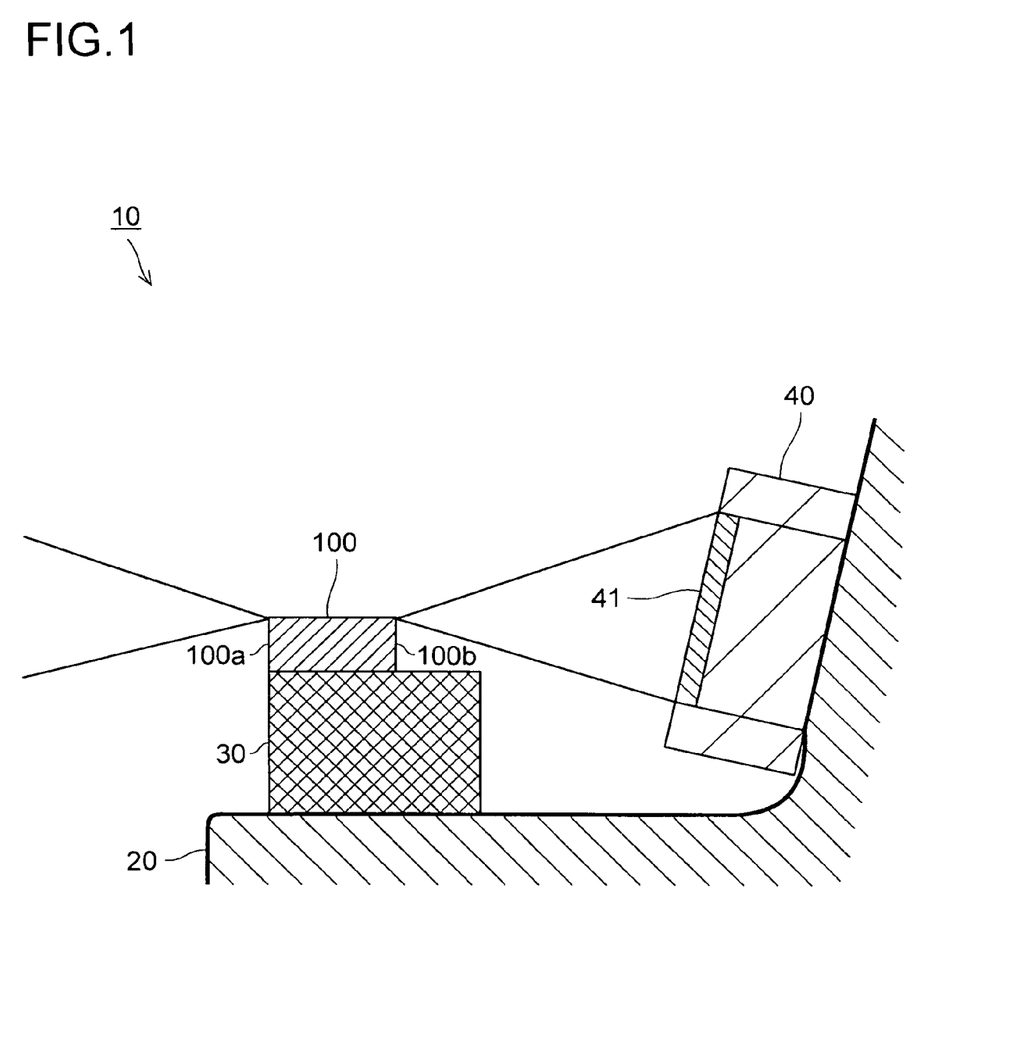
FIG. 1 is a sectional view of a main part of a semiconductor laser device according to the present invention.

FIG. 1 is a sectional view of a main part of a semiconductor laser device according to the present invention. A semiconductor laser device 10 includes a stem 20, which has a horizontal surface for mounting a chip and a slanted surface, a sub-mount 30, which is placed on the horizontal surface of the stem 20, a semiconductor laser chip 100, which is placed on the sub-mount 30, and a photodiode 40, which is placed on the slanted surface of the stem 20.

The semiconductor laser chip 100 has an emission surface 100a and a reflection surface 100b, which are the opposing end surfaces of a resonator. The photodiode 40 is provided on the side of the reflection surface 100b to detect light that exits the reflection surface 100b with a light receiving part 41 thereof. The structure of the semiconductor laser chip 100 and a method of manufacturing the semiconductor laser chip 100 are described next.

(Laser Wafer Fabrication)

Figure 2A:
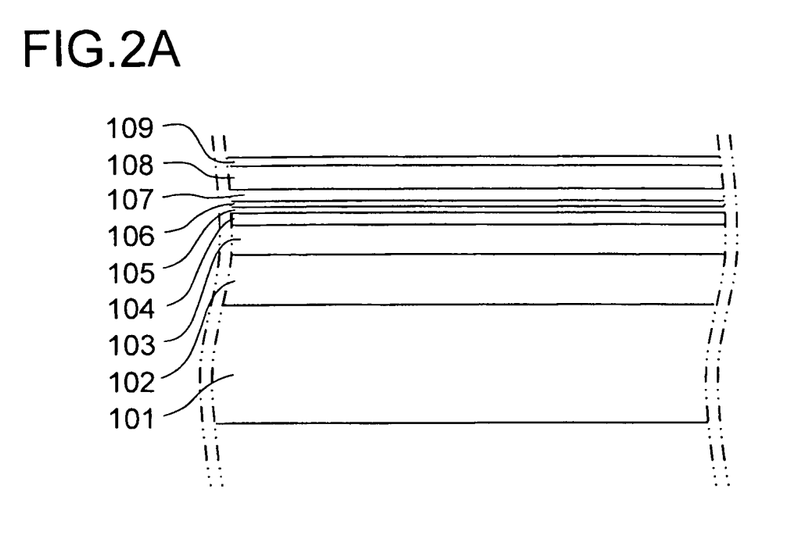
FIG. 2A is a diagram illustrating a semiconductor laser chip manufacturing process step according to the present invention.

FIGS. 2A and 2B and FIGS. 3A to 3C are diagrams illustrating process steps of manufacturing the semiconductor laser chip 100. First, as illustrated in FIG. 2A, an n-type GaN lower contact layer 102, an n-type $Al_{y1}Ga_{1-y1}N$ (0<y1<0.2) lower cladding layer 103, an n-type GaN lower guide layer 104, an active layer 105, a vaporization preventing layer 106, a p-type GaN upper guide layer 107, a p-type $Al_{y4}Ga_{1-y4}N$ upper cladding layer 108, and a p-type GaN upper contact layer 109 are layered in order on a first principal surface of an n-type GaN substrate 101. The lower contact layer 102 has a thickness of 0.1 to 10 μm (for example, 4 μm). The lower cladding layer 103 has a thickness of 0.5 to 3.0 μm (for example, 1.0 μm). The lower guide layer 104 has a thickness of 0 to 0.2 μm (for example, 0.1 μm). The active layer 105 has a multiple quantum well layer structure in which an $In_{x1}Ga_{1-x1}N$ quantum well layer and an $In_{x2}Ga_{1-x2}N$ barrier layer (x1>x2) are layered alternately. The vaporization preventing layer 106 is made of p-type $Al_{y3}Ga_{1-y3}N$ (0.05<y3<0.5). The upper guide layer 107 has a thickness of 0 to 0.2 μm (for example, 0.01 μm).

The substrate 101 may be a sapphire substrate, an undoped GaN or AlGaN substrate, or the like instead of an n-type GaN substrate. The lower cladding layer 103 may be formed from a material suitable for desired optical characteristics, such as a superstructure of n-type GaN and n-type AlGaN, or a combination of AlGaN layers that have different compositions.

The lower guide layer 104 or the upper guide layer 107 may be formed from n-type or p-type InGaN or AlGaN instead of n-type or p-type GaN, and may be omitted if the guide layer is not required by design choice. The composition and structure of the active layer 105 are set such that light having a wavelength of approximately 405 nm is emitted. The vaporization preventing layer 106 may have As, P, or other impurities mixed therein if the impurity acts to prevent the active layer from deteriorating in a period that follows the growth of the active layer and precedes the growth of the upper cladding layer 108.

Similarly to the lower cladding layer 103, the upper cladding layer 108 may be formed from a material suitable for desired optical characteristics, such as a superstructure of p-type GaN and p-type AlGaN, or a combination of AlGaN layers that have different compositions. The upper contact layer 109 may be formed from p-type InGaN, GaInNAs, GaInNP, or the like instead of p-type GaN.

Figure 2B:
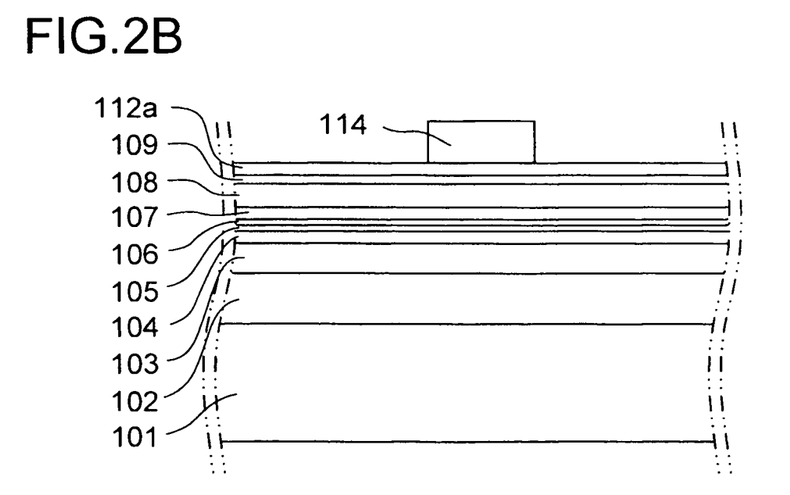
FIG. 2B is a diagram illustrating a semiconductor laser chip manufacturing process step according to the present invention.

Subsequently, as illustrated in FIG. 2B, a first p electrode 112a having, for example, Pd or Ni as a main component is formed by vacuum evaporation or other methods on the entire top surface of the wafer for which epitaxy has been finished. A stripe-patterned resist 144 with a stripe width of 1 to 3 μm (for example, 1.5 μm) is then formed by utilizing a photolithography process.

Figure 3A:
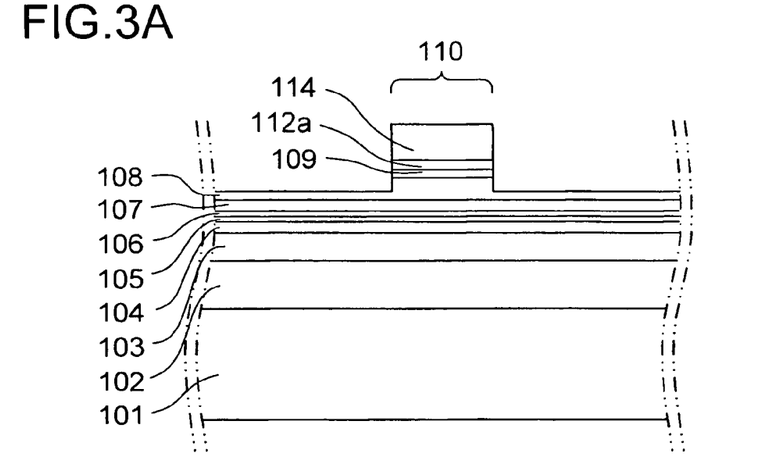
FIG. 3A is a diagram illustrating a semiconductor laser chip manufacturing process step according to the present invention.

As illustrated in FIG. 3A, the first p electrode 112a is etched by ion etching or wet etching to remove other regions than those below the stripe-patterned resist 114. The first p electrode 112a may alternatively be formed at the same time as a pad electrode, which is formed later. In this case, the resist 114 is formed directly on the wafer and the next step is executed immediately.

Next, the layers on the wafer are dug through the upper contact layer 109 and up to at least half way down the upper cladding layer 108 by RIE or other types of dry etching with the use of $SiCl_4$ or $Cl_2$ gas to form ridge stripes 110. The etching is preferably stopped at a point 0.05 μm to 0.2 μm from the bottom surface of the vaporization preventing layer 106 in the thickness direction of the cladding layer 108. If the etching stops before the 0.05 μm point, the semiconductor laser element may have a lower oscillation threshold but is lowered in kink level and therefore not suitable for high-power operation. If the etching reaches beyond the 0.2 μm point, it is not desirable either, because the oscillation threshold increases greatly and controlling the far field pattern (FFP) and other optical characteristics of the laser becomes difficult.

Figure 3B:
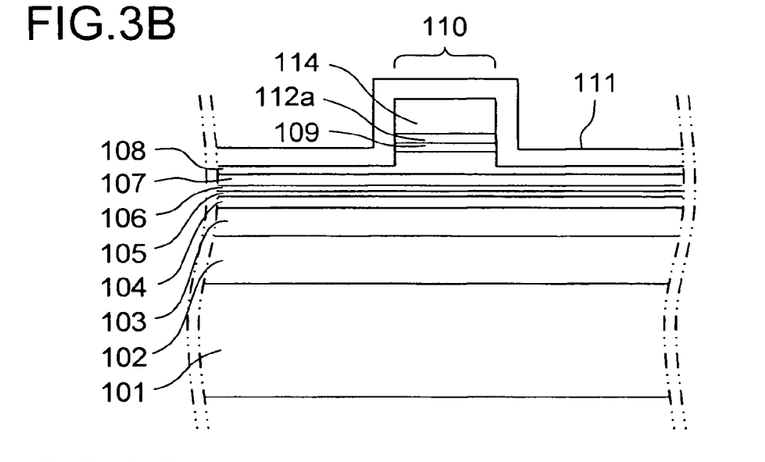
FIG. 3B is a diagram illustrating a semiconductor laser chip manufacturing process step according to the present invention.

As illustrated in FIG. 3B, a burying layer 111 is formed from $SiO_2$ to a thickness of 0.1 μm to 0.5 μm (for example, 0.3 μm) on the wafer, on which the forming of the ridge stripes 110 has been finished, to bury the ridges. On the $SiO_2$ layer, one or more layers for improving the adhesion with the first p electrode 112a may be formed. This layer may be formed from an oxide such as $TiO_2$, $ZrO_2$, $HfO_2$, or $Ta_2O_5$, a nitride such as TiN, TaN, or WN, or a metal such as Ti, Zr, Hf, Ta, or Mo.

Figure 3C:
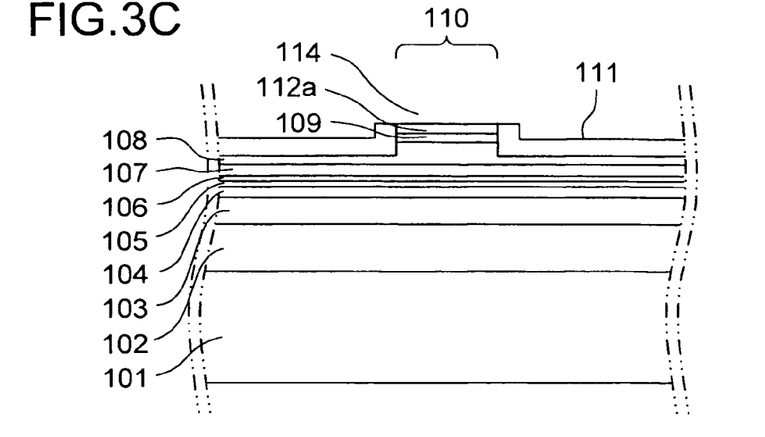
FIG. 3C is a diagram illustrating a semiconductor laser chip manufacturing process step according to the present invention.

Next, as illustrated in FIG. 3C, the resist 114 constituting the ridge stripes 110 is then dissolved by a solvent, and ultrasonic cleaning or a similar method is used in combination to expose the first p electrode 112a.

Electrode patterning is subsequently performed by a photolithography process with the use of a resist. On the patterned wafer, Mo/Au, W/Au, or other combinations are deposited by vacuum evaporation in the stated order to form a second p electrode 112b (see FIG. 5) such that most part of the first p electrode 112a is in contact with the second p electrode 112b. The pattern of openings in the resist may have a desired shape, taking a wire bonding region and other factors into account. In the case where the first p electrode is not formed before the forming of the ridge stripes 110, Ni/Au, Pd/Mo/Au, or other combinations may be deposited as a p electrode for supplying electric power from the outside.

The patterning is executed because of a risk that lowers reliability, such as leakage which occurs along a parting surface or at the time of coating. The patterning is accordingly performed avoiding parting-planned areas, where laser chips are planned to be parted from one another. Etching may instead be employed in the patterning of the second p electrode 112b. In this case, the electrode material is deposited by vapor deposition on the entire wafer surface, parts to be left as electrodes are protected with a resist through a photolithography process, and patterning is thereafter performed with, for example, an aqua regia-based etchant.

Note that, in some cases, the first p electrode 112a may become an issue regarding the risk such as leakage. In such cases, the first p electrode 112a needs to be patterned as well. Various patterning methods may be employed for the first p electrode 112a, including a method in which a photolithography process is performed before the first p electrode 112a is formed and metal is removed from parting-planned areas by lift-off, a method in which metal is removed from parting-planned areas by a photolithography process and etching immediately after the first p electrode is formed, and a method in which metal is removed from patting-planned areas by a photolithography process immediately after the second p electrode 112b is formed.

After the second p electrode 112b is formed, the laser chip is reduced to a thickness of about 60 to 150 μm (100 μm, for example) by polishing or grinding the rear surface of the wafer. The polished or ground surface is then treated by plasma etching or dry etching, Hf/Al or Ti/Al are deposited in the stated order on this surface by vacuum evaporation or other methods to form a first n electrode 113a (see FIG. 5), and its ohmic properties are guaranteed by heat treatment. Further, an n pad layer 113b of Ti/Pt/Au or the like (see FIG. 5) is formed on the first n electrode 113a in order to facilitate mounting. A wafer of a blue semiconductor laser is thus fabricated.

(Mirror Surface Fabrication)

Figure 4:
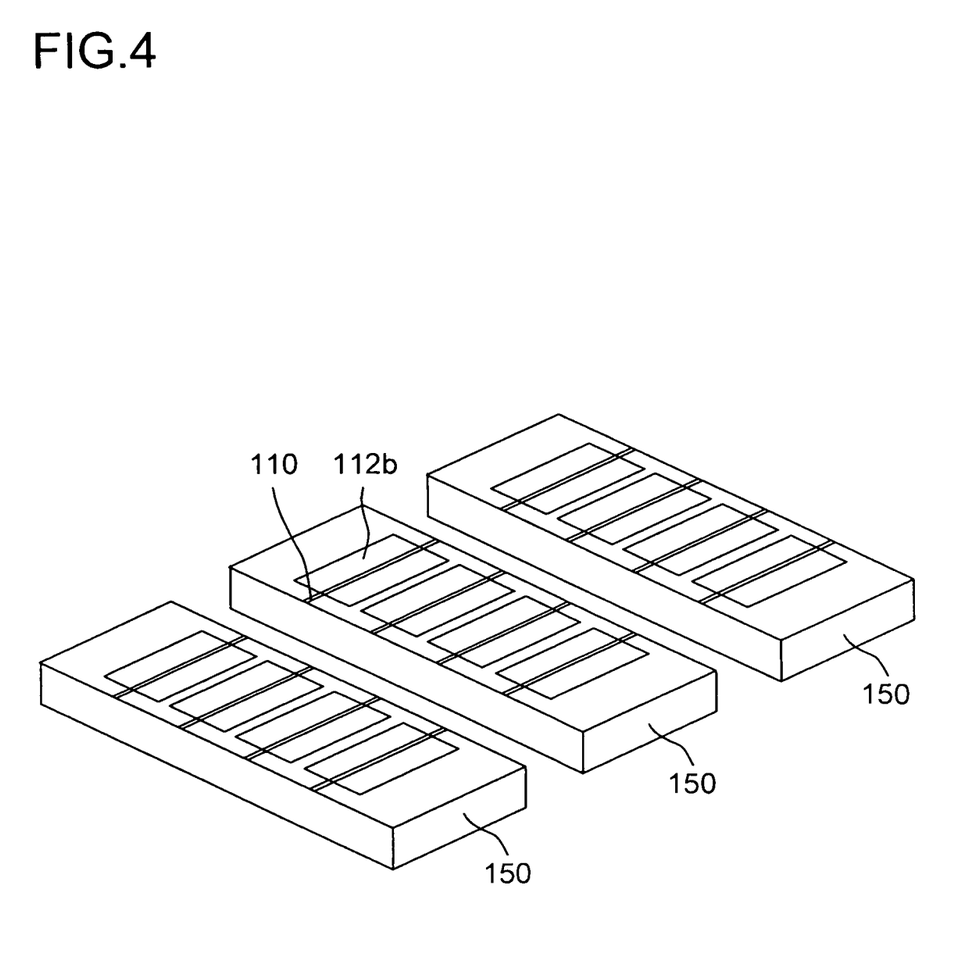
FIG. 4 is a diagram illustrating a semiconductor laser chip manufacturing process step according to the present invention.

The wafer is subsequently cut into bar-shaped pieces to create mirror surfaces on which coating films (dielectric multilayer films) are to be formed. As illustrated in FIG. 4, the mirror surfaces are created by cleaving the wafer substantially perpendicularly to the ridge stripes 110 and thus breaking up the wafer into a plurality of bars 150, which are each 250 to 1200 μm (for example, 300 μm) in width. The wafer has been thinned and therefore is cleaved easily. Scribe-and-break, breaking by laser scribing, or other methods may be used for the cleaving.

Figure 5:
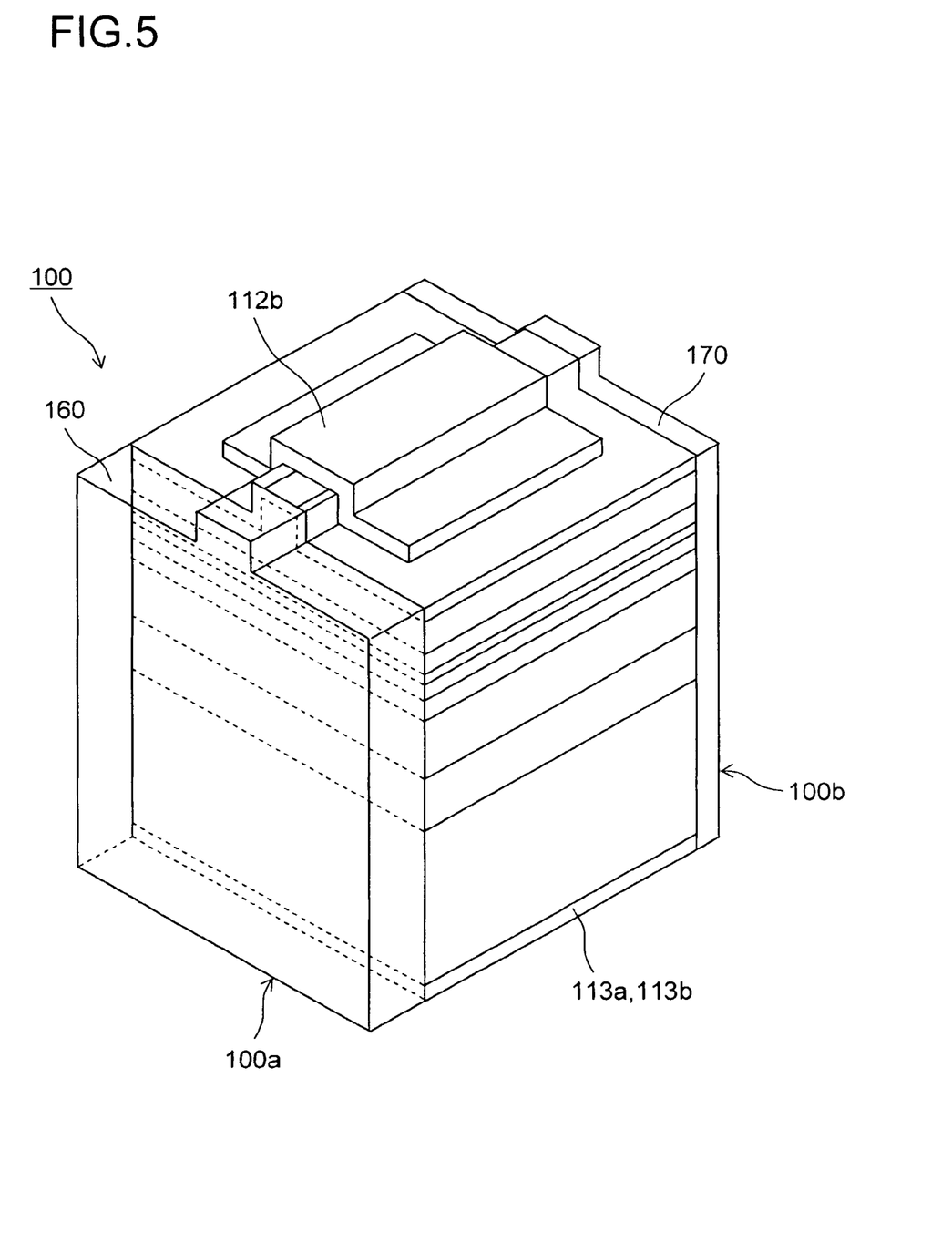
FIG. 5 is a perspective view of a semiconductor laser chip according to the present invention.

As illustrated in FIG. 5, a first dielectric multilayer film 160 and a second dielectric multilayer film 170 are formed on emission surfaces and reflection surfaces of the bars 150, respectively. The bars 150 are then broken into chips to obtain a plurality of semiconductor laser chips 100. In FIG. 5, parts in perspective view are indicated by dashed lines.

The first dielectric multilayer film 160 includes four layers of dielectric film in which a first film, a second film, a third film, and a fourth film are layered in order by vapor deposition. The first film is an AlON film having a refractive index $n_1$ of 2.1 and a physical film thickness $d_1$ of 6 nm. The second film is an $Al_2O_3$ film having a refractive index $n_2$ of 1.69 and a physical film thickness $d_2$ of 117 nm, and $d_2$ is determined based on a definition that d equals $\lambda_f/2n$. $\lambda_f$ is a wavelength at which the reflectance of the first dielectric multilayer film 160 peaks, here, 395 nm. The first film is the layer that is in contact with the semiconductor part, and hence a 6 nm-thick film of AlON (aluminum oxynitride) is used as the first film in order to prevent the oxidation of the semiconductor layer. The optical effects of the first film are cancelled out by forming an $Al_2O_3$ film to a thickness d of $\lambda_f/2n$ as the second film.

The third film is an $SiO_2$ film having a refractive index $n_3$ of 1.5 and a physical film thickness $d_3$ of 65.84 nm. The fourth film is an $Al_2O_3$ film having a refractive index $n_4$ of 1.69 and a physical film thickness $d_4$ of 58.43 nm, and $d_3$ and $d_4$ are determined based on a definition that d equals $\lambda_f/4n$. With the third film and the fourth film, the reflectance of each laser emission surface is set to 25%. Generally speaking, when a laser emission surface has a low reflectance in a semiconductor laser device for optical disk drives, coherent light returned from the disk upon arrival of laser light emitted from the semiconductor laser device at the disk enters the interior of the semiconductor laser device and changes the photon density inside the semiconductor laser resonator, thereby making laser oscillation unstable. This phenomenon is called return light noise. The reflectance of the emission surface needs to be 10% or higher in order to prevent return light noise. However, if the reflectance of the emission surface is set too high, the external differential efficiency of the semiconductor laser device is lowered. Accordingly, an appropriate emission surface reflectance is 10% to 50%. In order to achieve an external differential efficiency standard, 1.1±0.2 (W/A), the reflectance of the emission surface needs to be set to 10% to 50%.

On the other hand, the second dielectric multilayer film 170 includes six layers of dielectric film in which fifth to tenth films are layered in order by vapor deposition. The fifth film is an AlON film having a refractive index $n_5$ of 2.1 and a physical film thickness $d_5$ of 6 nm. The sixth film is an $Al_2O_3$ film having a refractive index $n_6$ of 1.69 and a physical film thickness $d_6$ of 122 nm, and $d_6$ is determined based on a definition that d equals $\lambda_r/2n$. $\lambda_r$ is a wavelength at which the reflectance of the second dielectric multilayer film 170 peaks, here, 415 nm. The fifth film and the sixth film serve as protection films for the semiconductor layer.

The seventh film is an $SiO_2$ film having a refractive index $n_7$ of 1.5 and a physical film thickness $d_7$ of 69.2 nm. The eighth film is a $TiO_2$ film having a refractive index $n_8$ of 2.53 and a physical film thickness $d_8$ of 41.0 nm. The ninth film is an $SiO_2$ film having a refractive index $n_9$ of 1.5 and a physical film thickness $d_9$ of 67.5 nm. The tenth film is a $TiO_2$ film having a refractive index $n_{10}$ of 2.53 and a physical film thickness $d_{10}$ of 40 nm, and $d_7$ to $d_{10}$ are determined based on a definition that d equals $\lambda_r/4n$. A common way to improve the reflectance of a dielectric multilayer film is to form films that have a refractive index relation expressed by $n_7 < n_8$ in the order of $n_7$, $n_8$, $n_9$, and $n_{10}$ to an optical film thickness of $\lambda_r/4n$. In this embodiment, the reflectance of the reflection surface is set to 80% due to restrictions regarding the threshold current and external differential efficiency of the semiconductor laser device, and hence the number of layers on the reflection surface needs to be six.

Figure 6:
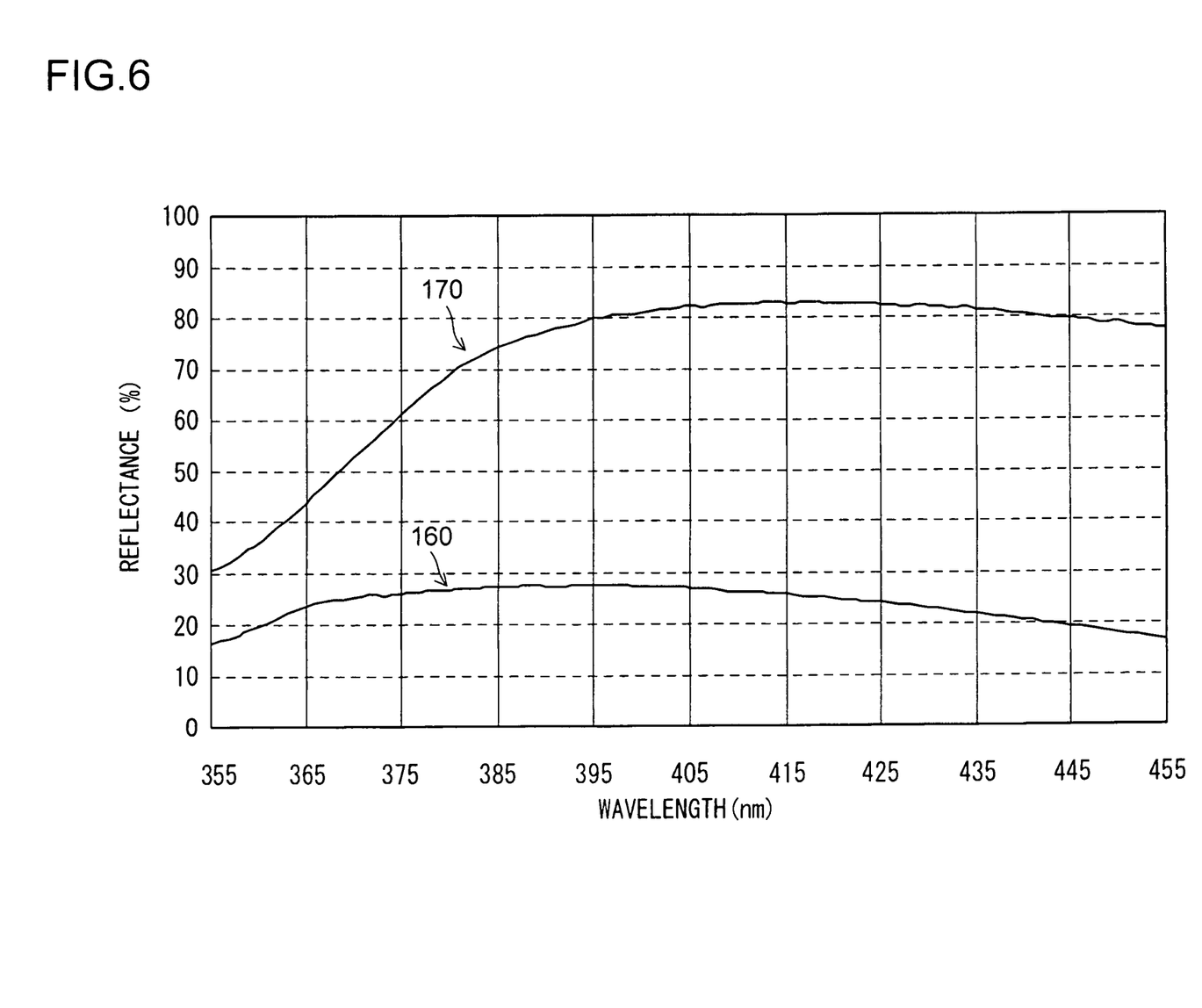
FIG. 6 is a graph showing reflectance-wavelength relations in first and second dielectric multilayer films of the present invention.

FIG. 6 is a graph showing reflectance-wavelength relations in the first and second dielectric multilayer films 160 and 170. It can be seen in the graph that $\lambda_f$ is 395 nm and that $\lambda_r$ is 415 nm. The power of light that exits the emission surface 100a is given as $P_f$, the power of light that exits the reflection surface 100b is given as $P_r$, the reflectance of the emission surface 100a is given as $R_f$, and the reflectance of the reflection surface 100b is given as $R_r$. A power ratio $P_r/P_f$ is then expressed as $P_r/P_f = \{(1-R_r)/(1-R_f)\} \times (\sqrt{R_f}/\sqrt{R_r})$.

Figure 7:
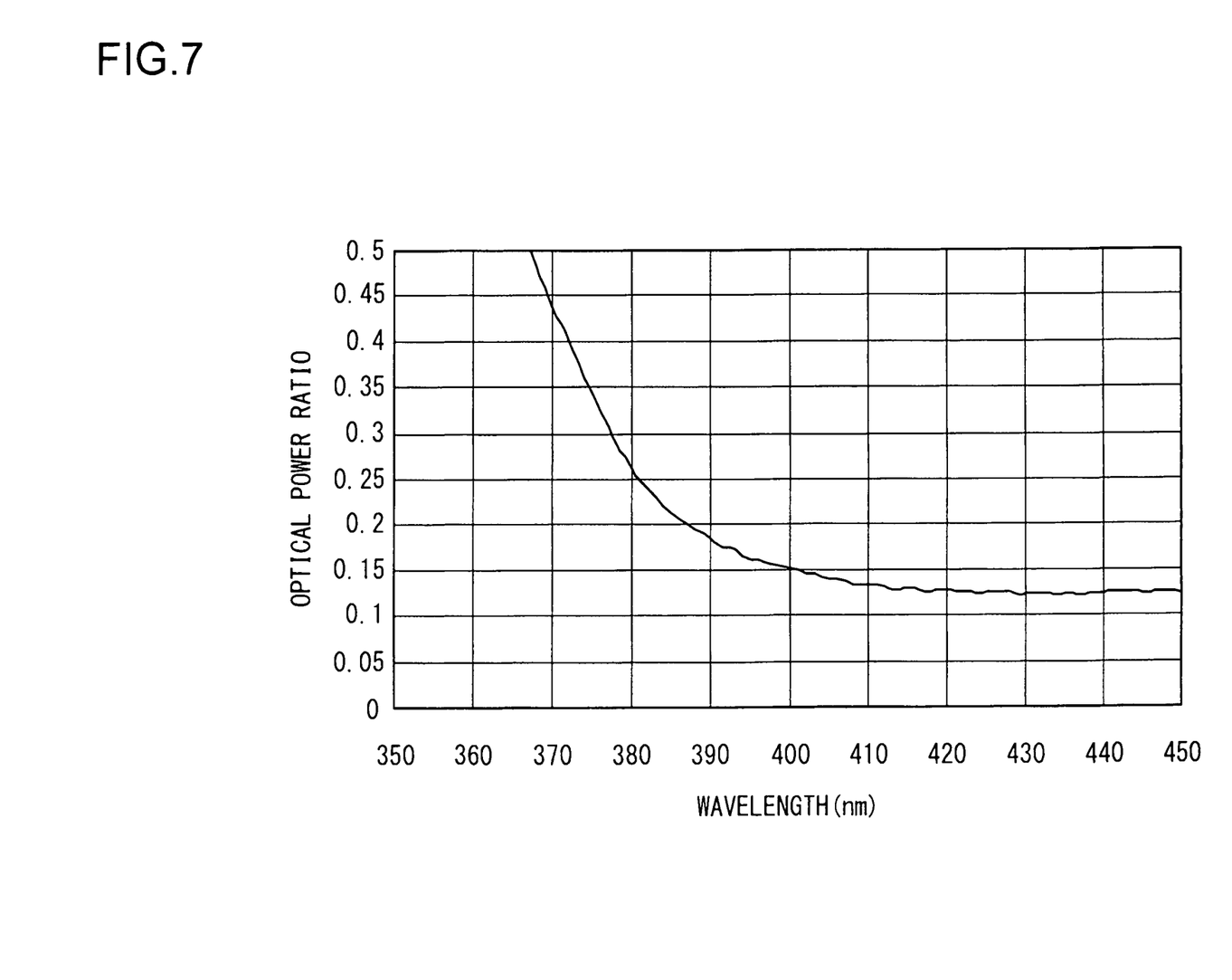
FIG. 7 is a graph obtained by converting FIG. 6 into a graph of power ratio $P_s/P_f$.

FIG. 7 is a graph obtained by converting FIG. 6 into a graph of power ratio $P_r/P_f$. It can be seen in the graph that the power ratio $P_r/P_f$ becomes smaller as the wavelength lengthens. When the sensitivity of the photodiode 40 to wavelengths is given as α, the wavelength dependence of the monitor current is expressed by $P_r/P_f \times \alpha$. The sensitivity α of the photodiode 40 when linearly approximated within a wavelength range of 300 nm to 500 nm is expressed as $\alpha = 0.23 \times \lambda + 19$ according to FIG. 12. In this wavelength range, the graph of the photodiode 40 has a positive gradient and $\lambda_f < \lambda_r$ therefore needs to be satisfied.

Figure 8:
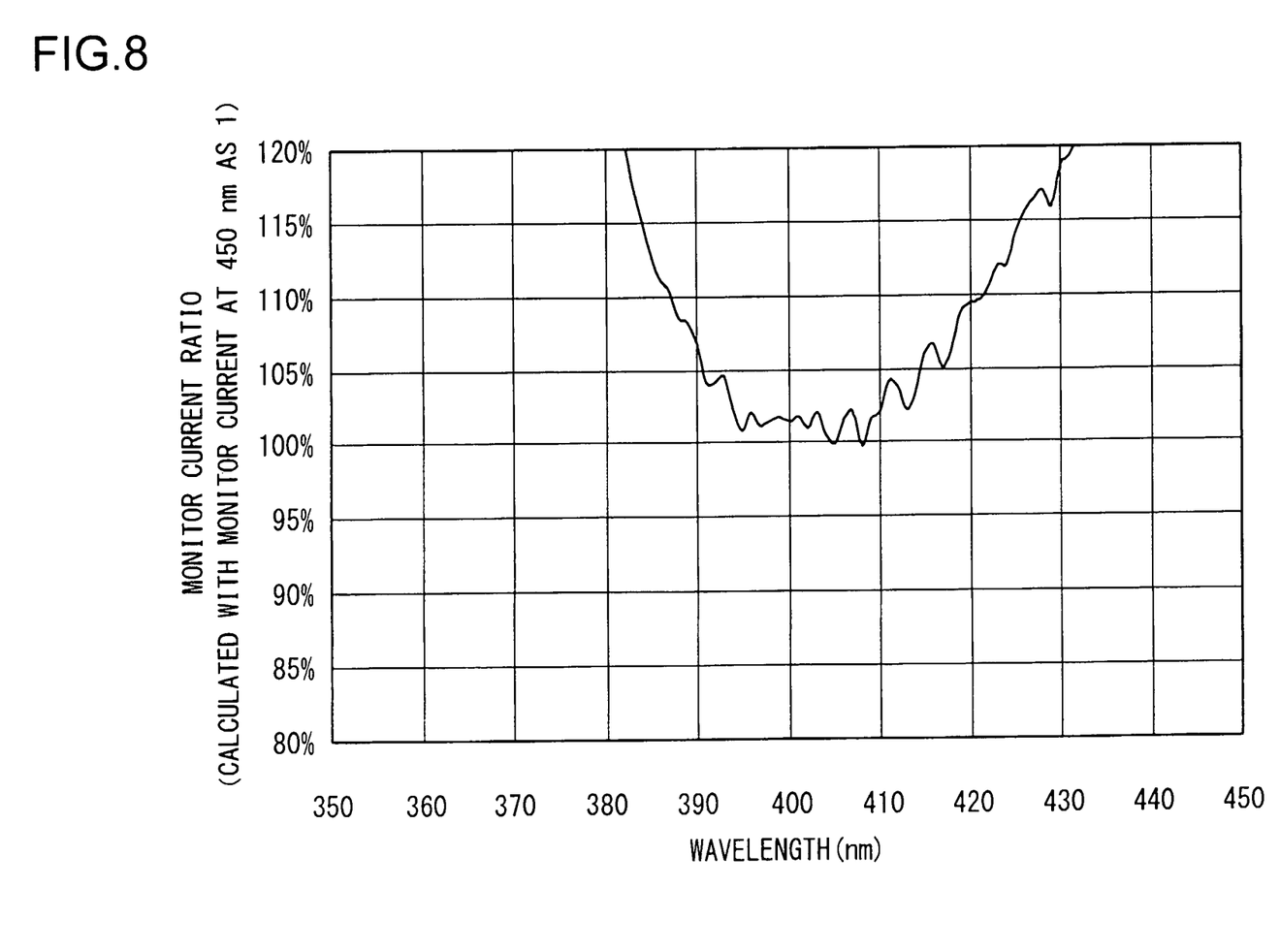
FIG. 8 is a graph showing the wavelength dependence of a monitor current in the present invention.

FIG. 8 is a graph showing the wavelength dependence of the monitor current which is calculated by multiplying the graph of FIG. 7 by α. FIG. 8 shows that an extremal value is reached at an oscillation wavelength $\lambda_1$ of the semiconductor laser chip 100. It can be said that the semiconductor laser chip 100 has temperature characteristics, from the fact that the Fermi distribution of electrons and holes in the semiconductor laser chip generally changes in relation to the ambient temperature and from the fact that the band gap of a semiconductor material is a function with respect to temperature. It is known that a change in ambient temperature therefore changes the oscillation wavelength of the semiconductor laser device. To give an example of observed manifestations of the temperature characteristics, when the ambient temperature is 25° C. and the semiconductor laser device is driven by auto power control (APC) driving at an oscillation wavelength of 405 nm and an emission surface side power of 20 mW, a shift in ambient temperature to 75° C. lengthens the oscillation wavelength of the semiconductor laser chip 100 by approximately 4 nm.

According to FIG. 8, the monitor current increases by approximately 2% when the oscillation wavelength lengthens from 405 nm by 4 nm. In other words, this semiconductor laser device has specifications capable of APC driving (a ±5% power change in response to a change in ambient temperature) despite a change in ambient temperature. The wavelength dependence of the monitor current described above is $P_r/P_f \times \alpha$ and, accordingly, relations $\lambda_f < \lambda_r$ and $\lambda_r - \lambda_f = 20$ nm need to be satisfied in order to guarantee the ±5% power change within a wavelength range of 405±10 nm. The relation $\lambda_r - \lambda_f = 20$ nm needs to be satisfied because there is a 5% difference between the sensitivity α of the photodiode 40 at 395 nm which is 109.9% and the sensitivity α of the photodiode 40 at 415 nm which is 114.9%, and the reflectance peaks of the emission surface and the reflection surface should have gradients of approximately 5% of the wavelengths.

In the semiconductor laser device 10, the fourth film may be formed from $Ta_2O_5$, $TiO_2$, $ZrO_2$, $Nb_2O_5$, or $Si_3N_4$, and the eighth film may be formed from $Al_2O_3$, $Ta_2O_5$, $ZrO_2$, $Nb_2O_5$, or $Si_3N_4$.

A comparative example is described next. A semiconductor laser device of the comparative example differs from that of the present invention only in the structures of the first and second dielectric multilayer films, and the rest of its structure is the same as that of the present invention. In the following description, a dielectric multilayer film of the comparative example on the emission surface side is referred to as a third dielectric multilayer film, and a dielectric multilayer film of the comparative example on the reflection surface side is referred to as a fourth dielectric multilayer film.

The third dielectric multilayer film includes four layers of dielectric film in which an eleventh film, a twelfth film, a thirteenth film, and a fourteenth film are layered in order by vapor deposition. The eleventh film is an AlON film having a refractive index $n_{11}$ of 2.1 and a physical film thickness $d_{11}$ of 6 nm. The twelfth film is an $Al_2O_3$ film having a refractive index $n_{12}$ of 1.69 and a physical film thickness $d_{12}$ of 116 nm. The thirteenth film is an $SiO_2$ film having a refractive index $n_{13}$ of 1.5 and a physical film thickness $d_{13}$ of 65 nm. The fourteenth film is an $Al_2O_3$ film having a refractive index $n_{14}$ of 1.69 and a physical film thickness $d_{14}$ of 59 nm.

On the other hand, the fourth dielectric multilayer film includes six layers of dielectric film in which fifteenth to twentieth films are layered in order by vapor deposition. The fifteenth film is an AlON film having a refractive index $n_{15}$ of 2.1 and a physical film thickness $d_{15}$ of 6 nm. The sixteenth film is an $Al_2O_3$ film having a refractive index $n_{16}$ of 1.69 and a physical film thickness $d_{16}$ of 117 nm. The seventeenth film is an $SiO_2$ film having a refractive index $n_{17}$ of 1.5 and a physical film thickness $d_{17}$ of 67.5 nm. The eighteenth film is a $TiO_2$ film having a refractive index $n_{18}$ of 2.53 and a physical film thickness $d_{18}$ of 40 nm. The nineteenth film is an $SiO_2$ film having a refractive index $n_{19}$ of 1.5 and a physical film thickness $d_{19}$ of 67.5 nm. The twentieth film is a $TiO_2$ film having a refractive index $n_{20}$ of 2.53 and a physical film thickness $d_{20}$ of 40 nm.

A wavelength $\lambda_f$ at which the reflectance of the third dielectric multilayer film peaks and a wavelength $\lambda_r$ at which the reflectance of the fourth dielectric multilayer film peaks are both 405 nm.

Figure 9:
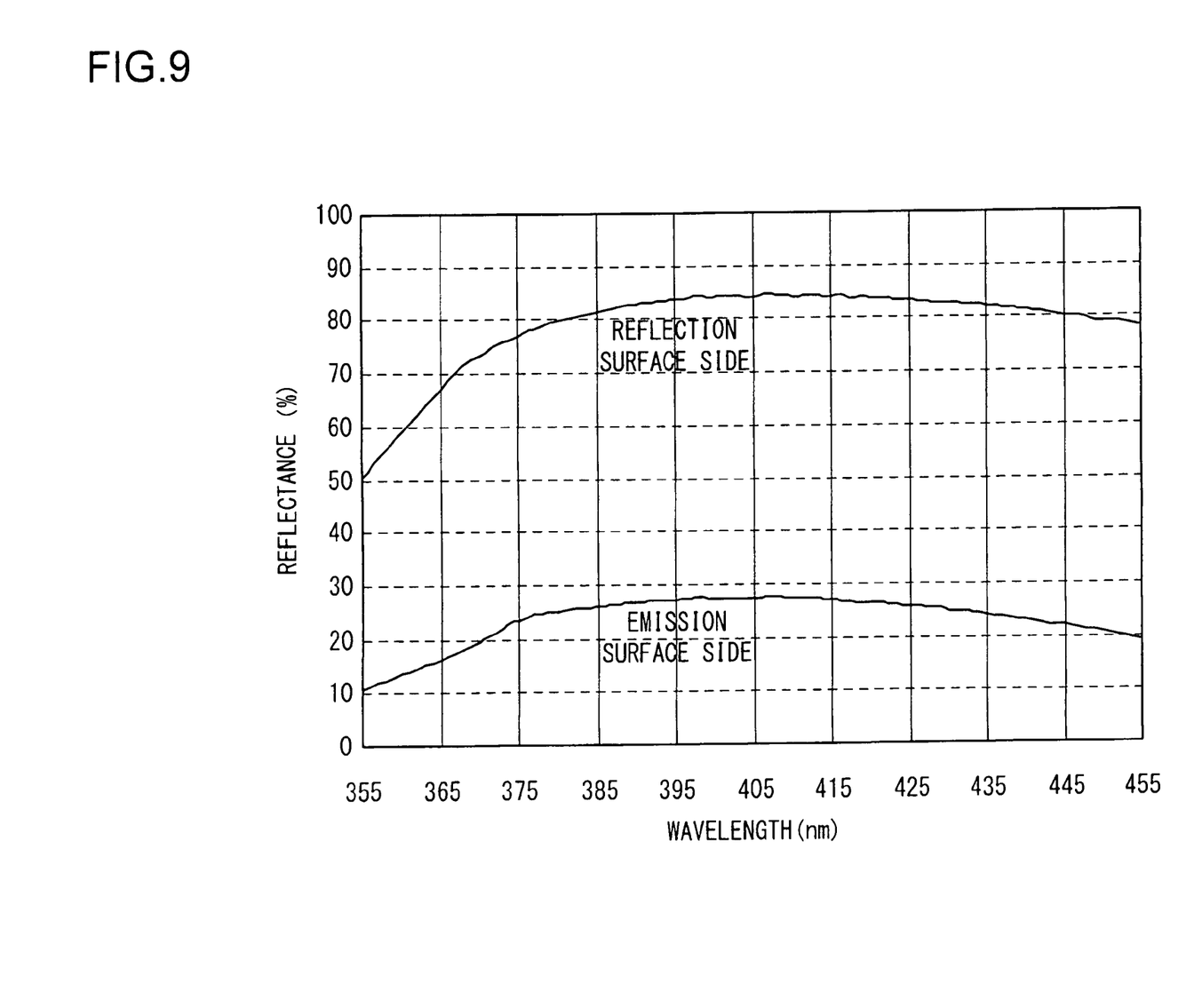
FIG. 9 is a graph showing reflectance-wavelength relations in third and fourth dielectric multilayer films of a comparative example.

FIG. 9 is a graph showing reflectance-wavelength relations in the third and fourth dielectric multilayer films. It can be seen in the graph that $\lambda_f$ is 405 nm and that $\lambda_r$ is 405 nm. The optical power ratio $P_r/P_f$ is calculated in the same manner as in the present invention described above.

Figure 10:
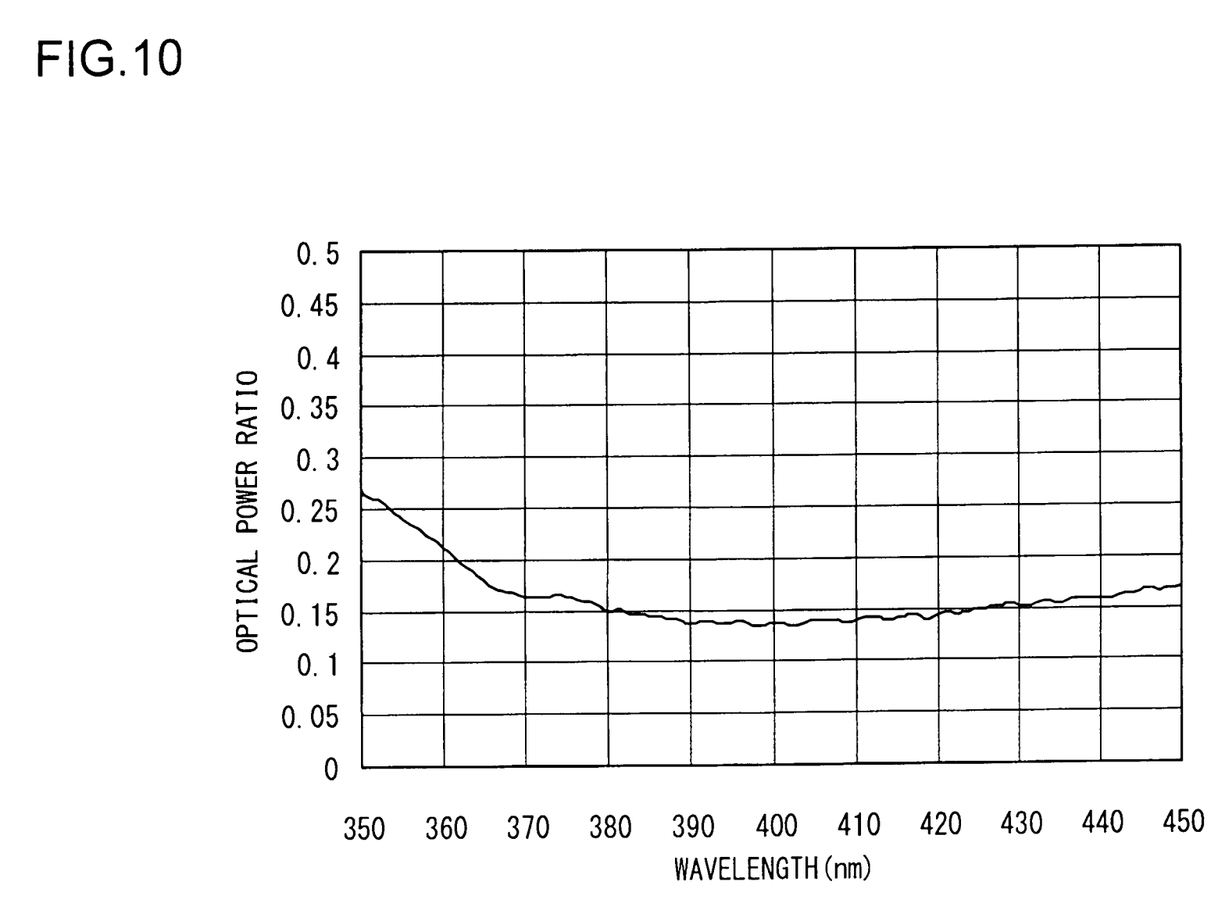
FIG. 10 is a graph obtained by converting FIG. 9 into a graph of power ratio $P_s/P_f$.

FIG. 10 is a graph obtained by converting FIG. 9 into a graph of power ratio $P_r/P_f$. It can be seen in FIG. 10 that the power ratio $P_r/P_f$ hardly changes in response to a change in wavelength, which means that the wavelength dependence is small. The wavelength dependence of the monitor current is calculated next.

Figure 11:
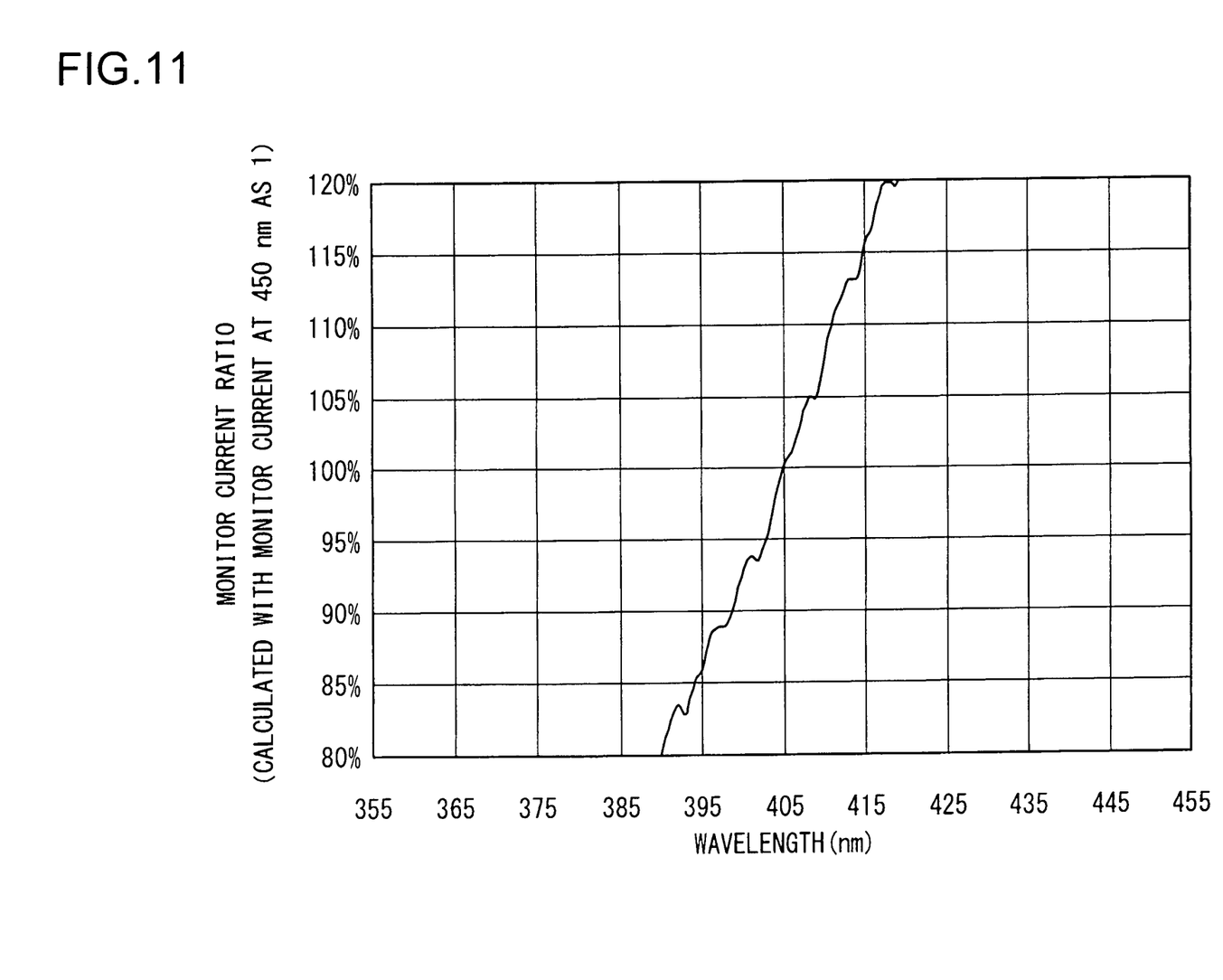
FIG. 11 is a graph showing the wavelength dependence of the monitor current in the comparative example.

FIG. 11 is a graph showing the wavelength dependence of the monitor current which is calculated by multiplying the graph of FIG. 10 by the sensitivity α of the photodiode 40 to wavelengths. FIG. 11 shows that the monitor current ratio increases as the wavelength lengthens, in short, that the monitor current has a large wavelength dependence.

Semiconductor laser chips have temperature characteristics. To give an example of observed manifestations of the temperature characteristics, when the ambient temperature is 25° C. and a semiconductor laser device is driven by APC driving at an oscillation wavelength of 405 nm and an emission surface side power of 20 mW, a shift in ambient temperature to 75° C. lengthens the oscillation wavelength of its semiconductor laser chip by approximately 4 nm.

According to FIG. 11, an increase in monitor current that is registered when the oscillation wavelength lengthens from 405 nm by 4 nm exceeds 5%. In other words, this semiconductor laser device does not have specifications capable of APC driving (a ±5% power change in response to a change in ambient temperature) when the ambient temperature changes.

The present invention is applicable to, for example, a semiconductor laser device that is used alone, a hologram laser device including a hologram element, a laser device that emits excitation light for illumination use, an optoelectronics IC device in which a semiconductor laser device is packaged unitarily with an IC chip for driving or processing such as signal detection, and a composite optical device in which a semiconductor laser device is packaged unitarily with a waveguide or a micro-optical element. The present invention is also applicable to an optical recording system and an optical disk system that include those devices, and to a light source system used for a spectral range from the ultraviolet to green.

What is claimed is:

1. A semiconductor laser device comprising:
    a semiconductor laser chip having an emission surface and a reflection surface which are opposing end surfaces of a resonator, the semiconductor laser chip including an active layer having a structure in which an $In_{x1}Ga_{1-x1}N$ quantum well layer and an $In_{x2}Ga_{1-x2}N$ barrier layer, wherein x1>x2 are layered alternately; and
    a photodiode for detecting light that exits from the reflection surface side,
    the photodiode having a sensitivity which rises as a wavelength of the exiting light lengthens in a range from 300 nm to 500 nm,
    wherein the emission surface has a first dielectric multilayer film formed thereon and the reflection surface has a second dielectric multilayer film formed thereon, and
    wherein the semiconductor laser chip has an oscillation wavelength $\lambda_1$;
    wherein the first dielectric multilayer film on the emission surface has a reflectance property which peaks at $\lambda_f$; and
    wherein the second dielectric multilayer film on the reflection surface has a reflectance property which peaks at $\lambda_r$; and wherein $\lambda_f < \lambda_1 > \lambda_r$.

2. A semiconductor laser device according to claim 1, wherein $\lambda_r - 20 \text{ nm} < \lambda_f < \lambda_1 < \lambda_r < \lambda_1 + 20 \text{ nm}$.

3. A semiconductor laser device according to claim 1, wherein $\lambda_r - \lambda_f = 20 \text{ nm}$.

4. A semiconductor laser device according to claim 1, wherein the photodiode has a sensitivity which rises as the wavelength lengthens and further the device has a power ratio which decreases as the wavelength lengthens, the power ratio being defined as $P_r/P_f$, where $P_r$ is the power of light that exits the reflection surface and $P_f$ is the power of light that exits the emission surface.

5. A semiconductor laser device according to claim 4, wherein $P_r/P_f \times \alpha$ reaches an extremal value at the oscillation wavelength $\lambda_1$ of the semiconductor laser chip, wherein α represents the sensitivity of the photodiode.

6. A semiconductor laser device according to claim 1, wherein the first dielectric multilayer film comprises a first film, a second film, a third film and a fourth film in order from the emission surface, and
    wherein the third film has a refractive index represented by $n_3$ and a physical film thickness represented by $d_3$;
    wherein the fourth film has a refractive index represented by $n_4$ and a physical film thickness represented by $d_4$;
    wherein $n_3 < n_4$, $d_3 = \lambda_f/4n_3$, and $d_4 = \lambda_f/4n_4$; and
    wherein the first dielectric multilayer film has a reflectance of 10 to 50%.

7. A semiconductor laser device according to claim 6, wherein the third film
    comprises $SiO_2$, and the fourth film comprises at least one member selected from a group consisting of: $Al_2O_3$; $Ta_2O_5$; $TiO_2$; $ZrO_2$; $Nb_2O_5$; and $Si_3N_4$.

8. A semiconductor laser device according to claim 6, wherein the second dielectric multilayer film comprises a fifth film, a sixth film, a seventh film and an eighth film in order from the reflection surface, and
    wherein the seventh film has a refractive index represented by $n_7$ and a physical film thickness represented by $d_7$;
    wherein the eighth film has a refractive index represented by $n_8$ and a physical film thickness represented by $d_8$;
    wherein the semiconductor laser chip has an oscillation wavelength represent by $\lambda_1$;
    wherein $n_7 < n_8$, $d_7 = \lambda_r/4n_7$, and $d_8 = \lambda_r/4n_8$; and
    wherein the second dielectric multilayer film has a reflectance of 80% or more.

9. A semiconductor laser device according to claim 8, wherein the seventh film comprises $SiO_2$, and the eighth film comprises at least one member selected from a group consisting of: $Al_2O_3$; $Ta_2O_5$; $TiO_2$; $ZrO_2$; $Nb_2O_5$; and $Si_3N_4$.

* * * * *